United States Patent [19]

Liu

[11] Patent Number: 5,171,610
[45] Date of Patent: Dec. 15, 1992

[54] LOW TEMPERATURE PHOTOCHEMICAL VAPOR DEPOSITION OF ALLOY AND MIXED METAL OXIDE FILMS

[75] Inventor: David K. Liu, San Pablo, Calif.

[73] Assignee: The Regents of the University of Calif., Oakland, Calif.

[21] Appl. No.: 574,204

[22] Filed: Aug. 28, 1990

[51] Int. Cl.⁵ .................. B05D 3/06; B05D 5/12; C23C 16/00

[52] U.S. Cl. ................... 427/586; 427/124; 427/126.2; 427/126.3; 427/252; 427/255.3; 427/584

[58] Field of Search ........ 427/53.1, 54.1, 124, 427/126.2, 126.3, 132, 252, 255.2, 255.3, 55

[56] References Cited

U.S. PATENT DOCUMENTS

| | | | |
|---|---|---|---|
| 3,667,100 | 5/1972 | Marchal et al. | 427/132 |
| 4,436,762 | 3/1984 | Lapatovich et al. | 427/38 |
| 4,510,182 | 4/1985 | Cornils et al. | 427/162 |
| 4,560,643 | 12/1985 | Finter et al. | 427/98 |
| 4,581,249 | 4/1986 | Kamiya | 427/53.1 |
| 4,631,199 | 12/1986 | Hall et al. | 427/54.1 |
| 4,654,226 | 3/1987 | Jackson et al. | 427/54.1 |
| 4,664,938 | 5/1987 | Walker | 427/39 |
| 4,678,536 | 7/1987 | Murayama et al. | 156/635 |
| 4,688,528 | 5/1987 | Ehrlich et al. | 427/53.1 |
| 4,748,045 | 5/1988 | Ehrlich et al. | 427/53.1 |
| 4,753,818 | 6/1988 | Rogers, Jr. | 427/54.1 |
| 4,778,693 | 10/1988 | Drozdowicz et al. | 427/53.1 |
| 4,778,744 | 10/1988 | Borrelli et al. | 430/290 |
| 4,814,294 | 3/1989 | West et al. | 437/200 |
| 4,839,196 | 6/1989 | Itoh | 427/53.1 |
| 4,859,492 | 8/1989 | Rogers, Jr. et al. | 427/42 |
| 4,880,492 | 11/1989 | Erdmann et al. | 156/610 |
| 4,888,204 | 12/1989 | Tutt et al. | 427/53.1 |
| 5,045,348 | 9/1991 | Brierley et al. | 427/54.1 |
| 5,080,927 | 1/1992 | Ikeda et al. | 427/54.1 |
| 5,096,737 | 3/1992 | Baum et al. | 427/54.1 |

OTHER PUBLICATIONS

Czekaj and Geoffroy, Inorganic Chemistry, vol. 27 (1988), pp. 8–10.
R. Job and J. Rovang, Synthetic Reactions in Inorganic and Metal-Organic Chemistry, vol. 6 (1976), pp. 367–371.
Madach et al., Chem. Ber., vol. 113 (1980), pp. 2675–2685.
Chini et al., Chim. Ital., vol. 90 (1960), pp. 1005–1020.
Knight et al., J. Chem. Soc., A (1970), pp. 654–658.
Tilney-Bassett, J. Chem. Soc., (1963), pp. 4784–4788.

Primary Examiner—Marianne Padgett
Attorney, Agent, or Firm—Paul R. Martin; Kathleen S. Moss; Pepi Ross

[57] ABSTRACT

Method and apparatus for formation of an alloy thin film, or a mixed metal oxide thin film, on a substrate at relatively low temperatures. Precursor vapor(s) containing the desired thin film constituents is positioned adjacent to the substrate and irradiated by light having wavelengths in a selected wavelength range, to dissociate the gas(es) and provide atoms or molecules containing only the desired constituents. These gases then deposit at relatively low temperatures as a thin film on the substrate. The precursor vapor(s) is formed by vaporization of one or more precursor materials, where the vaporization temperature(s) is selected to control the ratio of concentration of metals present in the precursor vapor(s) and/or the total precursor vapor pressure.

21 Claims, 5 Drawing Sheets

LOW TEMPERATURE PHOTOCHEMICAL VAPOR DEPOSITION OF ALLOY AND MIXED METAL OXIDE FILMS

This invention was made in the course of or under contract DE-AC03-76SF00098 between the U.S. Department of Energy and the University of California for the operation of Lawrence Berkeley Laboratory.

DESCRIPTION

1. Technical Field

This invention relates to deposition of alloy and metal oxide thin films on a substrate at relatively low temperature.

2. Background Art

Chemical vapor deposition ("CVD") is widely used in solid state device fabrication to deposit thin films of insulators, dielectrics and semiconductors on a substrate. One drawback of conventional, thermally-activated CVD is the high temperatures necessarily employed, which limits the choice of useful substrates and may alter the dopant profiles originally deposited in materials subjected to the high temperature processing. Further, conventional, thermally-activated CVD may cause diffusion of impurities present in the reactor or in the substrate into the growing film.

An example of the use of CVD to deposit iron cobalt ($Fe_xCo_y$) and iron cobalt oxide ($Fe_xCo_yO_z$) thin films is disclosed in a letter by Czekaj and Geoffroy, published in Inorganic Chemistry, 27 (1988), pp. 8-10. These workers used heteronuclear carbonyl clusters $HFeCo_3(CO)_{12}$ and $CpFeCo(CO)_6$ (Cp=cyclopentadienyl) to form mixed-metal Fe/Co alloy and oxide thin films using a CVD process at temperatures of the order of $T=325°$ C. Carbon monoxide (CO) was used as a carrier gas with a flow rate of 30-50 $cm^3$/min, and film thicknesses of the order of 0.8-1.5 $\mu$m were obtained. The workers note that for temperatures below 300° C., the deposition rate is too slow to be practical, whereas for deposition at temperatures exceeding 350° C., nucleation in the gas phase occurs, with concomitant formation of a poorly-adhering soot-like coating on the substrate.

A four-step process for production of homogeneous coatings of two or more metals is disclosed by Cornils et al., in U.S. Pat. No. 4,510,182. Dinuclear or polynuclear mixed metal compounds are used as the starting material and are heated to a temperature equal to 85-90 percent of the final temperature over a period of 5-10 minutes. The temperature is then reduced to a second temperature of the order of two-thirds the final temperature for 90-150 minutes, after which the temperature is raised to a final temperature $T=350°$ C. for a period of 60-120 minutes. This method is useful for coating solar collectors with relatively high a/e ratios.

U.S. Pat. No. 4,581,249, issued to Kamiya, discloses the use of a starting gas in a reaction chamber and irradiation of the gas by light of a wavelength that will excite and decompose the gas into two different molecules containing Si or SiH, for deposit thereof as a film. The inventor notes that light with two or more different wavelengths may be required for decomposition of a given reactant, such as $SiH_4$, into two different curves of reaction products. Hall, et al., in U.S. Pat. No. 4,631,199, disclose a process for depositing an oxide layer such as $SiO_2$ on a substrate by exposing the substrate to a vapor phase reactant (containing the Si) and an oxygen-containing precursor that may be $N_2O$ or $O_2$ in a predetermined ratio. The gas mixture is irradiated by light of a selected wavelength to dissociate the oxygen-containing precursor to provide neutral oxygen atoms that react with the vapor phase reactant to form the oxide.

A photochemical vapor deposition reaction chamber is disclosed by Jackson et al. in U.S. Pat. No. 4,654,226. The reaction chamber is divided into a reaction zone, having a deposition substrate therein, and a flash zone, which is bounded on one side by a transparent window through radiation of a selected wavelength is transmitted. The reaction zone and the flash zone are separated by a transparent curtain that also transmits light of the selected wavelength.

Ehrlich et al., in U.S. Pat. Nos. 4,668,528 and 4,748,045, disclose a process for photodeposition of films of metal, containing oxyhalide vapors, such as $CrO_2Cl_2$, on various substrates such as Si, $SiO_2$, GaAs and glass. Photolysis of adsorbed reactant molecules on the substrate causes formation of the desired films. Direct writing of the metal oxyhalide on the substrate is thereby facilitated. Thin chromium oxide films produced in this manner are strongly ferromagnetic.

Photolysis of reaction gases adsorbed on the surface of a substrate is also disclosed by Murayama et al. in U.S. Pat. No. 4,678,536. This invention utilizes the observation that, in some gases at least, the adsorption spectrum of a molecule adsorbed on the surface of a substrate differs from the adsorption spectrum of the molecule existing in a gas.

Rogers, in U.S. Pat. No. 4,753,818, discloses a process for depositing an oxide layer of $SiO_x$ on a substrate by exposing the substrate to a selected vapor phase reactant, a selected oxygen-containing precursor and a selected physical quenching gas. The gas mixture is irradiated by deep ultraviolet radiation to dissociate and excite the oxygen-containing precursor and to convert the oxygen gas in an excited state, such as $O(^1D)$ to the ground state form $O(^3P)$.

Drozdowicz et al. disclose the pyrolytic decomposition of an organometallic gas mixture for photolithographic mask repair in U.S. Pat. No. 4,778,693.

Borrelli, in U.S. Pat. No. 4,778,744, discloses deposition of a metal oxide on porous glass by photolysis of organometallic compounds with which the glass is impregnated.

West et al. employ a precursor for cobalt, such as a cobalt carbonyl, and for silicon, such as a silane or halogenated silane, for chemical vapor deposition of a cobalt silicide film in U.S. Pat. No. 4,814,294. The ratio of silicon to cobalt in the film is controlled by varying the substrate temperature as film growth proceeds.

In U.S. Pat. No. 4,859,492, Rogers et al. disclose a low temperature photochemical vapor deposition process that uses a first vapor phase reactant containing silicon, a second selected vapor phase reactant and an oxygen-containing precursor. The gas mixture is irradiated adjacent to a substrate by radiation of a predetermined wavelength to induce a reaction to form an oxide coating on the substrate. The oxide coating includes oxides of silicon and lead in a predetermined proportion.

Growth of a uniform thickness film by photochemical vapor deposition on a substrate is disclosed by Itoh in U.S. Pat. No. 4,839,196. The focal point irradiating light beam is positioned in the vicinity of the region on the substrate where film deposition rate is lowest when the light beam is absent and the light beam power density is increased in this region relative to the power density in other regions adjacent to the substrate.

The use of intramolecularly stabilized organometallic compounds as a source of metal for vapor phase deposition of thin films is disclosed by Erdmann et al. in U.S. Pat. No. 4,880,492.

In U.S. Pat. No. 4,888,204, Tutt et al. disclose use of an organometallic compound containing gold, possibly mixed with a carrier gas, for photochemical deposition of high purity gold films on a substrate at ambient temperature. Photodissociation of the organometallic compound is induced by irradiation thereof with ultraviolet light of a wavelength corresponding to strong absorption by the organometallic compound.

What is needed is an approach that allows deposition of alloys or mixed metal oxides with controllable metal-metal ratios as thin films on a substrate maintained at temperatures of the order of room temperature.

SUMMARY OF THE INVENTION

This need is met by a method that begins with an organometallic precursor, or two or more such precursors, containing a first metal and a second metal that are to be incorporated in a desired or mixed metal oxide thin film alloy. The precursor (or precursors) is heated to a selected vaporization temperature $T_v$ below its melting temperature, to provide a vapor containing molecules of the precursor material(s) at a selected concentration ratio of the first and second metals adjacent to the substrate upon which depositions occur. The vapor is irradiated with light having a selected wavelength range and a selected power density, to at least partially dissociate the vapor, resulting in combination of the first and second metals as an alloy thereof on the substrate at room temperature.

If a mixed metal oxide thin film is to be provided instead, oxygen vapor at a selected concentration is also provided, and the first and second metals and oxygen are allowed to combine as a mixed metal oxide thin film on the substrate.

BEST MODE FOR CARRYING OUT THE INVENTION

Figure 1:
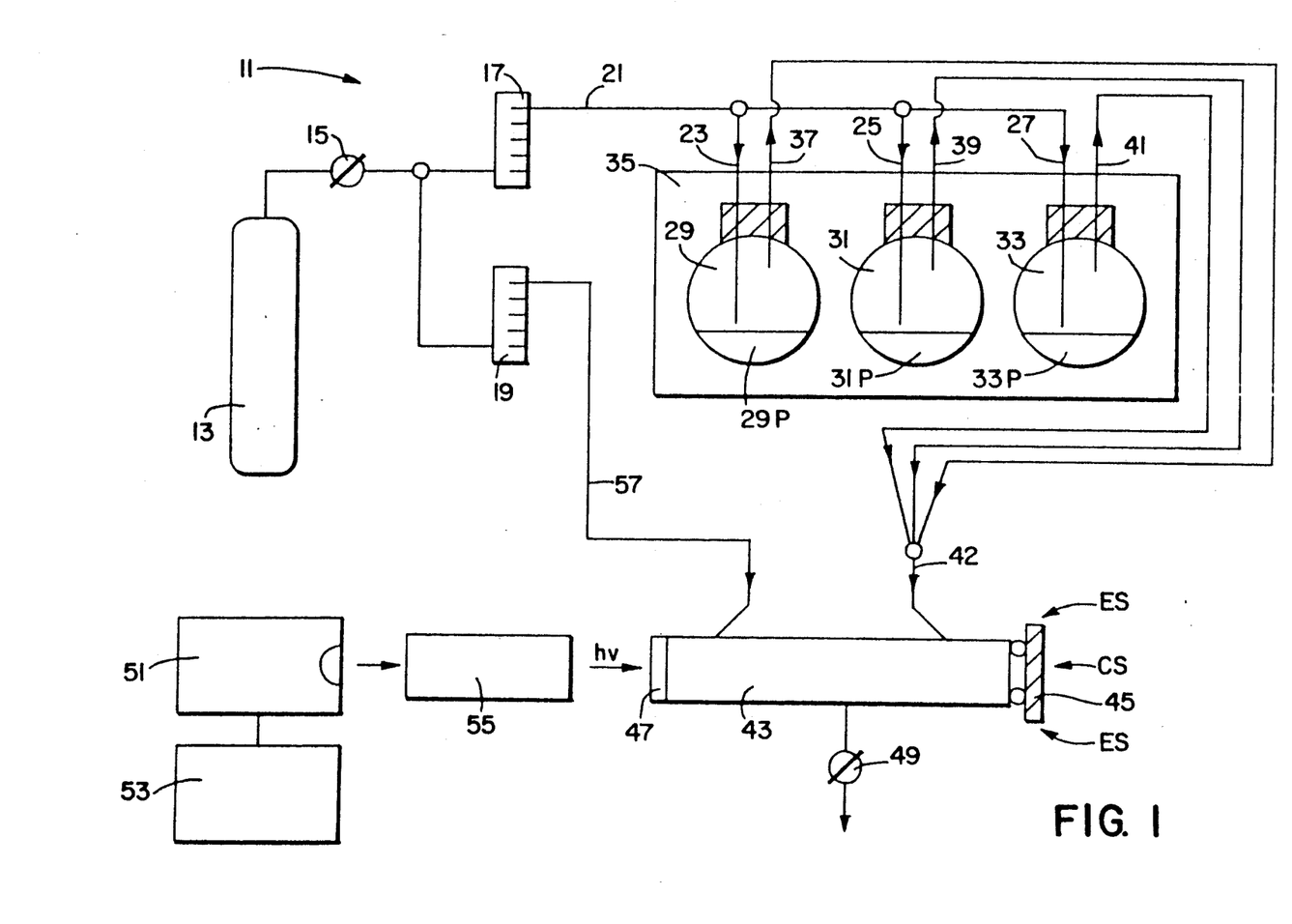
FIG. 1 is a schematic view of apparatus useful in practicing the invention to produce either an alloy thin film or a mixed metal oxide thin film.

With reference to FIG. 1, in one embodiment 11 of the invention, a gas container 13 is provided that holds an inert carrier gas such as CO, $N_2$, or Ar. Exit of the gas from the container 13 is controlled by a valve 15, and the outlet gas is passed through a first gas flow meter 17 and a second gas flow meter 19 (optional) in parallel as shown in FIG. 1. After the carrier gas passes through the first flow meter 17 it enters a carrier feed line 21 that directs a portion of the carrier gas to one or more distribution feed lines 23, 25 and 27 that respectively feed the carrier gas to one or more precursor containers 29, 31 and 33 that hold precursor materials 29P, 31P and 33P, respectively. Each container 29, 31 and 33 may have its own flow meter and feed line. The precursor containers 29, 31 and 33 are all contained in a temperature control device 35, such as an oven or a cooling bath, or in separate devices, that can be adjusted to a predetermined temperature of the order of the melting temperature $T_M$ of the precursor material or materials.

By adjusting the temperature control device 35 to a temperature T of the order of $T_M$, a portion of the precursor material 29P, 31P and 33P in each precursor container 29, 31 and 33 is vaporized and is carried by the carrier gas in the respective secondary feed lines 37, 39 and 41 to an inlet plenum 42 in which the precursor gases are allowed to mix. Alternatively, the carrier gas and precursor gases may all be carried in a single secondary feed line to the plenum 42. The gases in the plenum 42 flow into a vapor deposition reactor chamber 43 adjacent to a substrate 45 positioned at one end of the reactor chamber. A window 47 in the reactor chamber 43 at a second end thereof is provided, where the window is transparent to electromagnetic radiation ("light") in a selected wavelength range. A valve 49 is provided in or adjacent to the reactor chamber 43 to allow removal of excess gases from the reactor chamber to an exhaust system or to a recovery system, as discussed below.

A light source 51, such as a high pressure mercury arc lamp, light emitting diode or laser producing light of suitable wavelengths, and an associated power supply 53 are provided to produce a light beam having wavelengths in a suitable range. Optionally, the light beam is passed through a wavelength filter 55 and then passes through the window 47 into the reactor chamber 43. Optionally, some of the carrier gas may be passed through the second gas flow meter 19 and through a purge feed line 57, then directed at the window 47 in the interior of the reactor chamber 43, to purge the chamber region adjacent to the window and keep it relatively transparent for the light beam.

When the precursor gas or gases enters the reactor chamber 43 adjacent to the substrate 45, the gas is irradiated by the light beam and caused to dissociate so that a mixture of metal atoms is available to deposit as a thin film on the substrate 45. One precursor container 29 may contain a precursor material having the desired mixture of metals. Alternatively, two or more precursor containers 29 and 31 may be used to provide the desired precursor vapors.

Figure 2:
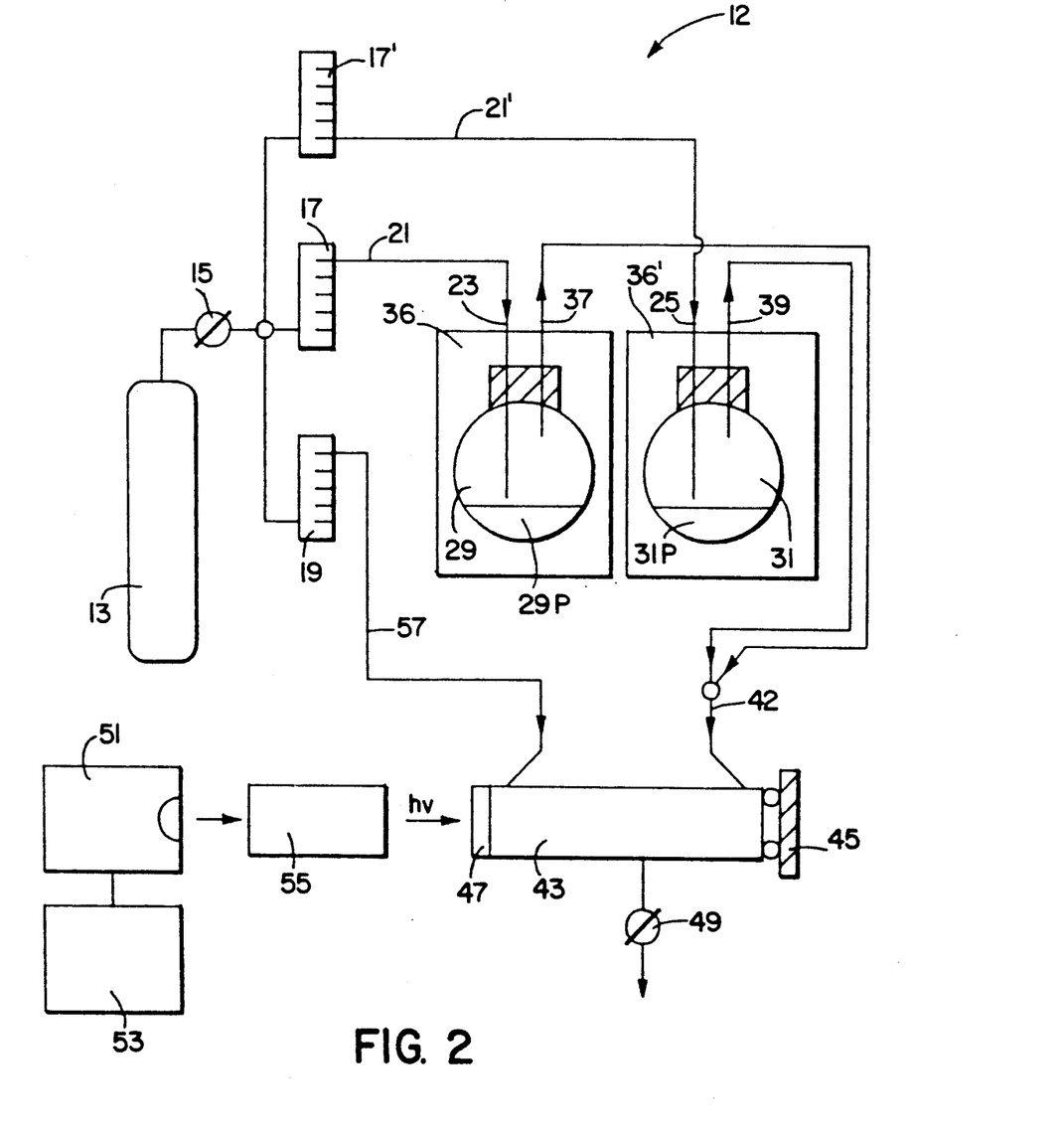
FIGS. 2 and 3 are schematic views of alternative apparatus embodiments useful in practicing the invention.

The two precursor containers 29 and 31 may be positioned in a single temperature control device 35, as shown in FIG. 1, or may be positioned in two or more separate temperature control devices 36 and 36', as shown in the embodiment 12 in FIG. 2. Where multiple temperature control devices 36 and 36' are used, each such device can be maintained at an independent temperature so that the concentration ratio of the two precursor materials 29P and 31P in gaseous form can be thereby controlled. The carrier gas in the container 13 is directed through two flow meters 17 and 17' and along the respective gas feed lines 21 and 21' to the precursor containers 36 and 36', as shown.

When a single heteronuclear metal carbonyl precursor is used, as shown in the embodiment 14 in FIG. 3, vaporization temperatures of the bimetallic compounds were set at approximately five degrees below the melting point of the bimetallic compound in the oven 35 in FIG. 3 in order to control the total vapor pressure of the precursor compound thereby produced. Preferably, the gas delivery tube 37 is wrapped in heating tape and kept at the oven temperature in order to prevent condensation of the precursor vapor before the vapor enters the reaction chamber 43.

If a mixed metal oxide thin film is to be formed, one of the precursor containers may be used to provide an oxygen-containing precursor, as shown in FIG. 1. Alternatively, as shown in FIG. 3, a separate source 59 of oxygen may be provided, outside the temperature control device 35, that has its own pressure control. Here, the oxygen gas from the source 59 is preferably routed through a flow meter 20 and through a container 61 that has water or water vapor 63 therein, before the oxygen gas is delivered to the plenum 42 by another feed line 65 for mixing with the metal precursor(s).

The disclosed method uses a photochemical vapor deposition process ("PHCVD") to provide low temperature deposition of an alloy or a mixed metal oxide as a thin film on a selected substrate. The thin film materials which can be produced by this PHCVD process include but are not limited to Fe-Co and Fe-Ni alloys and their respective mixed metal oxides, which are known to possess unique magnetic properties and are of interest in memory storage applications. Other alloys and mixed metal oxide thin films with other desirable properties may also be prepared by this method. The deposition temperature may be of the order of room temperature so that a wide variety of substrates may be used, such as glass (an oxide of silicon, beryllium, boron, phosphorus or other suitable matrix material), Al, Cu, Si, Ge, GaAs or other suitable insulator, metallic or semiconductor material. Optionally, the exterior of the substrate holder (e.g., stainless steel) is purged with air during photo-dissociation of the precursor vapor(s), in order to dissipate any excess heat and maintain the film temperature at the selected substrate value. This rules out any substantial thermal contribution to the PHCVD reaction, which normally requires much higher temperatures of the order of $T=325°$ C. Use of substrate temperatures of the order of room temperature, of the order of $T=25°$ C., have been successfully demonstrated with many different thin film alloys and oxides. The substrate temperature $T_s$ may also be controlled to enhance the quality and/or film build-up rate of the film on the substrate. Use of higher substrate temperatures will allow greater mobility of the metal constituents on the substrate or film surface and is expected to produce higher quality films but generally lower film thickness growth rates. The PHCVD process is performed at reduced pressures of 670–1340 Pascals, using carrier gas flow rates of 20–80 cm$^3$/min to carry the metal carbonyl vapor(s) into the reaction chamber. The gas CO appears to be a superior carrier gas, compared to other relatively inert gases such as N$_2$ or Ar because CO can suppress thermal decomposition of the metal carbonyl precursor vapor in the precursor container(s) and in the connecting tubes that carry the precursor and carrier gas to the reaction chamber. The PHCVD process produces one or more vapors of precursor materials containing the desired metals, preferably as organometallic precursors, and photo-decomposes or photo-dissociates the precursor (or precursors) by irradiation with light of suitable wavelengths to produce metal constituents that combine and deposit on the adjacent substrate as a thin film alloy at relatively low temperatures.

The light source 51 for the PHCVD experiments may be a 200 Watt, high pressure mercury arc lamp with a power density of about 2 Watts/cm$^2$, measured at the substrate surface. Alternatively, the light source 51 may be a laser or light-emitting diode having wavelengths in a range (e.g., $\lambda=300$–360 nm) that is suitable for photo-dissociation of the precursor vapor materials such as metal carbonyl vapor(s). Two such lasers are N$_2$ and XeCl(exoimer), which emit light at $\lambda=337$ nm and $\lambda=350$ nm, respectively. If a mixed metal oxide is to be deposited on the substrate, vapors of the metal-containing precursor and/or oxygen-containing precursor may be photolysed. Oxygen-containing precursors include O$_2$, O$_3$, N$_2$O and NO$_2$, as discussed by Hall in U.S. Pat. No. 4,631,199, discussed above. Here, atomic oxygen in the form of O($^3$P) or O($^1$D) is produced by irradiation of the precursor by light of wavelength $\lambda=175$–195 nm (O$_2$, N$_2$O), 170–360 nm (O$_3$) or 350–600 nm (NO$_2$).

In order to make the PHCVD process cost effective, the unreacted and un-photo-dissociated precursor vapors are caused to exit from the reaction chamber through a valve or other flow control means 49 and are collected in a cold trap maintained at liquid nitrogen temperatures, $T=-196°$ C. These recovered gases may be recycled and reused as part of the precursor material.

The first PHCVD technique uses two separate organometallic precursors, as suggested by the presence of the precursor containers 29 and 31 in FIG. 1. For example, to prepare Fe-Co thin films, either Fe(CO)$_5$ and Co(CO)$_3$NO, or Fe(CO)$_5$ and Co$_2$(CO)$_8$, are used. For synthesis details on Co(CO)$_3$NO, see R. Job and J. Rovang, *Synthetic Reactions in Inorganic and Metal-Organic Chemistry*, vol. 6 (1976), pp. 367–371. These precursor materials could either be heated to a selected temperature in an oven or chilled to a selected temperature in an ice water bath. The photo-dissociation reactions were allowed to continue for time intervals of the order of 15 minutes. The resulting thin films were metallic in appearance and had a typical thickness of 0.05 $\mu$m, as measured by a stylus profilometer, corresponding to a deposition rate of 0.2 $\mu$m/hour. Scanning electron microscopic analysis indicates that these film surfaces are granular, with particle sizes of 0.2–0.4 $\mu$m. Auger electron spectroscopy (AES) indicates the presence of 5–10 percent O and less than 1 percent C, in addition to the Fe and Co in the bulk of the films. Most of the bulk oxygen and carbon can probably be eliminated with use of a better vacuum system.

The Fe/Co ratio present in the alloy thin film formed on the substrate as determined by x-ray fluorescence (XRF) spectroscopy is found to vary systematically with the temperatures at which the Fe-containing and Co-containing vapors are produced, as indicated in Table 1.

TABLE 1

| Temperature control of Fe/Co concentration ratios of alloy thin films prepared by PHCVD. | | | |
|---|---|---|---|
| T(Fe(CO)$_5$) | T(Co(CO)$_3$NO) | T(Co$_2$(CO)$_8$) | Fe/Co Ratio |
| 20° C. | −1° C. | | 1.40 |
| 20 | 4 | | 1.25 |

TABLE 1-continued

Temperature control of Fe/Co concentration ratios of alloy thin films prepared by PHCVD.

| T(Fe(CO)$_5$) | T(Co(CO)$_3$NO) | T(Co$_2$(CO)$_8$) | Fe/Co Ratio |
|---|---|---|---|
| 20 | 20 | | 1.00 |
| 2 | 20 | | 0.78 |
| 20 | | 45° C. | 0.66 |
| 5 | | 45 | 0.21 |
| 0 | | 45 | 0.13 |

Thus, the concentration ratio of the two metals deposited in the alloy or mixed metal oxide thin film may be varied by independently varying the temperatures of the precursor materials that produce the precursor vapors. This approach may require use of separate temperature control devices for each of the two precursor materials or use of separate means for partially insulating one or both of the precursor containers in a single device.

Figure 4:
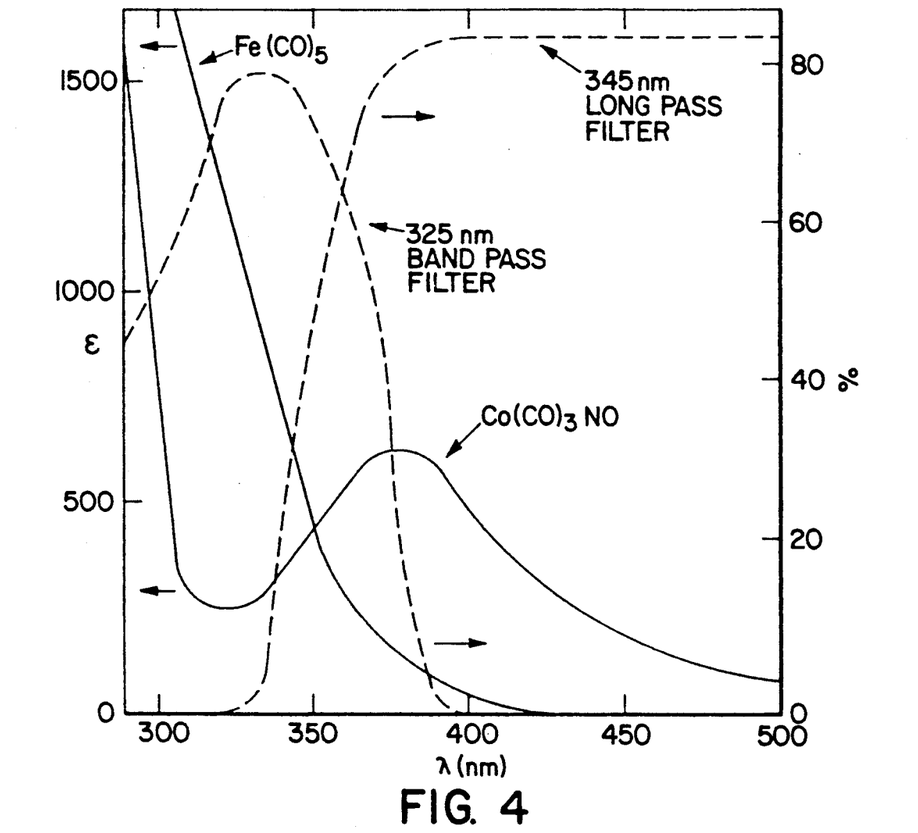
FIG. 4 is a plot of absorption coefficients versus wavelength for two useful precursor materials and transmission coefficients versus wavelength for two light filters that may be used to promote selective dissociation of these precursors.

Concentration of two metals in an alloy or mixed metal oxide thin film can also be controlled by selected excitation of the vapors in an organometallic precursor. FIG. 4 illustrates the absorption spectrum for two of the precursor materials, Fe(CO)$_5$ ("Fe compound") and Co(CO)$_3$NO ("Co compound"). If the filter 55 is chosen to be a long pass filter with a nominal threshold of $\lambda = 345$ nm, photo-dissociation of the Co compound is favored over photo-dissociation of the Fe compound. If the filter 55 is chosen to be a band pass filter with a peak value of $\lambda = 325$ nm and an upper threshold of approximately of $\lambda = 380$ nm, photo-dissociation of the Fe compound will be favored over photo-dissociation of the Co compound. Other wavelength filters may be used to favor or to discriminate against photo-dissociation of a particular metal carbonyl or bimetallic compound. Table 2 presents experimental results on Fe/Co concentration ratios of thin films deposited on Al substrates by photolysis of Fe(CO)$_5$ and Co(CO)$_3$NO, both thermostated at 20° C., without and with the use of these filters applied to the light beam used for irradiation.

TABLE 2

Fe/Co concentration ratios of thin films produced by PHCVD with light beam filtering.

| Photolysis Condition | Fe/Co Ratio |
|---|---|
| With 325 nm band pass filter | 1.31 |
| No filter | 1.00 |
| With 345 nm long pass filter | 0.52 |

Thus, vaporization temperature and the effective range of irradiation wavelengths may be independently or concurrently, to vary the concentration ratio of two metals, such as Fe/Co or Fe/Ni, deposited as an alloy or a mixed metal oxide thin film on a substrate. The substrate temperature T$_s$ may also be controlled to enhance the quality and/or film build-up rate of the film on the substrate. Elements such as Fe, Co and Ni in thin films exhibit interesting magnetic properties, and one may fine tune the magnetic properties of the metal alloy thin films and the metal oxide thin films by control of the concentration ratio adjacent to the substrate surface.

A second PHCVD technique involves the use of a single metal carbonyl precursor containing heteronuclear metal-metal bond(s) for the preparation of alloy and mixed metal oxide thin films. Where a combination of at least two of the three metals Fe, Co and Ni is to be used to form the thin film alloy or the thin film oxide, the precursor material may be chosen from the class of compounds including but not limited to (C$_5$H$_5$)FeCo(CO)$_6$, (see Modach et al., Chem. Ber. 113 (1980) 2675–2685), HFeCo$_3$(CO)$_{12}$, (see Chini et al., Chim. Ital. 90 (1960) 1005–1020), (C$_5$H$_5$)Fe$_2$Co(CO)$_9$ (see Knight et al., J. Chem. Soc. (A) (1970) 654–658) and (C$_5$H$_5$)FeNi(CO)$_3$ (see Tilney-Basset, J. Chem. Soc. (1963) 4784–4788). The vaporization temperatures used for (C$_5$H$_5$)FeCo(CO)$_6$, HFeCo$_3$(CO)$_{12}$, (C$_5$H$_5$)Fe$_2$Co(CO)$_9$ and (C$_5$H$_5$)$_2$FeNi(CO)$_3$ were approximately T = 50° C., 80° C., 95° C. and 125° C., respectively. The PHCVD reactions were carried out for time intervals of as long as one hour, and the deposition rates for Fe-Co thin films using the first three compounds above were approximately 0.2 μm/hr, 0.02 μm/hr and 0.02 μm/hr, respectively. The Fe-Ni thin film deposition rate using the fourth compound above was approximately 0.01 μm/hr. The resulting films were metallic in appearance. Auger electron spectroscopic analyses of thin films, prepared using these (C$_5$H$_5$)-containing precursors mentioned above, indicated that 5–10 percent O and 0–5 percent C were also present in the bulk of the films.

The theoretical and experimentally determined (using x-ray fluorescence spectroscopy) Fe/Co stoichiometric ratios are set forth in Table 3. The major advantage of this single precursor approach is that the stoichiometry of the metals in the precursor can generally be retained in the deposited film and that thin alloy and mixed metal oxide films can be prepared with predetermined concentration of two or more metals. The experimentally determined Fe/Co ratio for (C$_5$H$_5$)Fe$_2$Co(CO)$_9$ is much lower than expected because of recombination of the gaseous constituents before substrate deposition occurs.

TABLE 3

Fe/Co and Fe/Ni concentration ratios of thin films, prepared by PHCVD, using a single precursor containing heteronuclear metal-metal bond(s).

| Precursor | Fe/Co (theor.) | Fe/Co (exper.) | Fe/Ni (theor.) | Fe/Ni (exper.) |
|---|---|---|---|---|
| (C$_5$H$_5$)FeCo(CO)$_6$ | 1.00 | 1.19 | — | — |
| HFeCo$_3$(CO)$_{12}$ | 0.33 | 0.31 | — | — |
| (C$_5$H$_5$)$_2$FeNi(CO)$_3$ | — | — | 1.00 | 0.98 |
| (C$_5$H$_5$)Fe$_2$Co(CO)$_9$ | 2.00 | 0.85 | — | — |

As mentioned above, mixed metal oxide thin films can be prepared via PHCVD using either a single heteronuclear metal carbonyl precursor or two or more sample metal carbonyl precursors, in conjunction with an oxygen-containing precursor. For example, when PHCVD was carried out using (C$_5$H$_5$)FeCo(CO)$_6$ with O$_2$ as carrier gas using the embodiments represented in FIG. 3, AES analysis showed a thin film containing a Fe/Co ratio of 1.24 and about 25% O was formed (see illustrative Example 3), as compared to a thin film containing a Fe/Co ratio of 1.19 and about 9% O using CO as carrier gas (see illustrative Example 2).

The alloy or oxide films produced by the method discussed above often have a thickness near the center CS (FIG. 1) of the substrate 45 that is approximately twice the thickness of the film near one of the edges ES of the substrate 45 within the reaction chamber 43. The film thickness may be made somewhat more uniform by increasing the distance, measured from the gas inlet end 44 to the substrate 45, from about one cm to a larger value such as 3 cm. However, this may reduce the film deposition rate at all points from an average of 0.2 μm/hour to a smaller rate.

Figure 5:
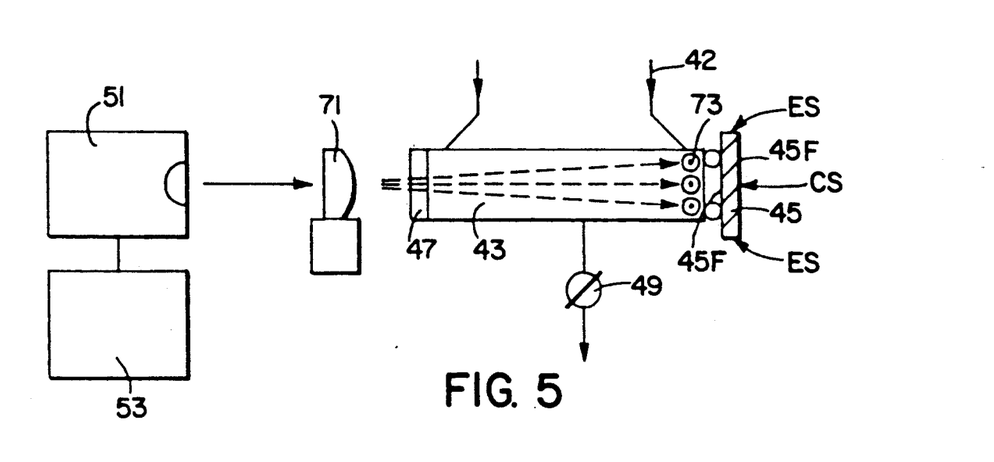
FIG. 5 illustrates an embodiment of the invention that produces a more uniform metal alloy or oxide film thickness.

As an alternative approach, illustrated in FIG. 5, the light beam from the light source 51 may be passed through an active focusing element 71 that focuses the light beam into a focus line 73 (seen end-on as a point) whose position adjacent to the substrate 45 periodically moves back and forth along the exposed face 45F of the substrate. The rate of linear displacement along the substrate face 45F is not constant but varies with position. This rate is highest near the center CS of the substrate and decreases monotonically as the focus line 73 moves away from the center CS toward an end ES of the substrate. The variation of rate with position of the focus line 73 is chosen to produce approximately uniform film thickness on the substrate, by producing more reactants from the precursor (and oxygen, if required) in regions where the rate of linear displacement of the focus line 73 is lower than average. Fewer reactants are produced from the precursor where the rate of linear displacement is higher than average, because excitation of the reactants by the light is present for a shorter time interval at any position adjacent to the substrate. For example, this rate of linear displacement may be 2V (V=velocity of focus line movement) at or near the center CS of the substrate, may be V at the substrate edges ES, and may vary approximately linearly with position between the positions CS and ES.

As a second alternative approach, also illustrated implicitly in FIG. 5, the beam focus diameter of the focus line 73 may be varied, monotonically or otherwise, between a relatively "tight" or small focus diameter near the substrate ends ES and a larger focus diameter near the substrate center CS, as the focus line 73 sweeps back and forth adjacent to the substrate face 45F. The rate of linear displacement of the focus line 73 may be approximately constant or may vary with position as illustrated in the first alternative above. A smaller focus diameter will produce a larger number of reactant particles adjacent to the substrate face 45F, and inversely.

EXAMPLE 1

Preparation of Fe-Co Alloy Thin Film Using Fe(CO)$_5$ and Co(CO)$_3$NO Precursors The PHCVD reaction was carried out using the apparatus represented by FIG. 1, except that no O$_2$ supply was provided. In separate 100-ml round bottom flasks 29 and 31 were placed 3.0 ml each of Fe(CO)$_5$ and Co(CO)$_3$NO. Both flasks were maintained at 20° C. in a constant temperature bath. The metal carbonyl vapors were carried into the PHCVD cell 43 using CO carrier gas from a cylinder 13 with a flow rate of 20 cm$^3$/min as controlled by flow meter such as 17. The interior of the quartz window 47 was purged with CO with a flow rate of 50 cm$^3$/min as controlled by a flow meter 19. A pre-cleaned p-Si(1,1,1) substrate 45 was mounted on a stainless steel holder, and both were air-cooled to maintain at 25° C. during the experiment. The system was evacuated to about 700 Pascals using a mechanical vacuum pump via the PHCVD cell outlet 49. The light source was a 200-Watt mercury arc lamp with a power density of about 2 W/cm$^2$ as measured by a power meter at the substrate. The photolysis time was about 15 minutes. The resultant deposit was smooth and metallic in appearance. The film thickness measured by a profilometer was about 0.1 μm, corresponding to a deposition rate of about 0.4 μm/hr. X-ray fluorescence spectroscopy showed a Fe/Co ratio of 1.00 and that this concentration ratio was uniform throughout the entire deposit (~1×2 cm). Auger electron spectroscopy confirmed a Fe/Co ratio of about 1 and showed about 7 percent O and about less than 1 percent C in the bulk of the deposit.

EXAMPLE 2

Preparation of Fe-Co Alloy Thin Film Using Fe(CO)$_5$ and Co(CO)$_3$NO Precursors - Vaporization Temperature Control of Fe/Co Ratio The PHCVD reaction was carried out using the apparatus represented by FIG. 2, except that no O$_2$ supply was provided. In separate 100-ml round bottom flasks (29 and 31) were placed 3.0 ml each of Fe(CO)$_5$ and Co(CO)$_3$NO. flask containing Fe(CO)$_5$ (29) was maintained at 20° C. in a constant temperature bath 36, while the flask containing Co(CO)$_3$NO was immersed in an ice-water cooling bath 36 at −1° C. The metal carbonyl vapors were carried into the PHCVD cell 43 using CO carrier gas from a cylinder 13 with a flow rate of 20 cm$^3$/min as controlled by flow meters 17 and 17'. The interior of the quartz window 47 was purged with CO with a flow rate of 50 cm$^3$/min as controlled by a flow meter 19. A pre-cleaned p-Si(1,1,1) substrate 45 was mounted on a stainless steel holder, and both were air-cooled to maintain at 25° C. during the experiment. The system was evacuated to about 700 Pascals using a mechanical vacuum pump via the PHCVD cell outlet 49. The light source was a 200-Watt mercury arc lamp with a power density of about 2W/cm$^2$ as measured by a power meter at the substrate. The photolysis smooth and metallic in appearance. The film thickness measured by a profilometer was about 0.08 μm, corresponding to a deposition rate of about 0.3 μm/hr. X-ray fluorescence spectroscopy showed a Fe/Co ratio of 1.24 and that this concentration ratio was uniform throughout the entire deposit (~1×2 cm).

EXAMPLE 3

Preparation of Fe-Co Alloy Thin Film Using Fe(CO)$_5$ and Co(CO)$_3$NO Precursors - Excitation Wavelength Control of Fe/Co Ratio The PHCVD reaction was carried out using the apparatus represented by FIG. 1, except that no O$_2$ supply was provided. In separate 100-ml round bottom flasks 29 and 31 were placed 3.0 ml each of Fe(CO)$_5$ and Co(CO)$_3$NO. Both flasks were maintained at 20° C. in a constant temperature bath 35. The metal carbonyl vapors were carried into the PHCVD cell 43 using CO carrier gas from a cylinder 13 with a flow rate of 20 cm$^3$/min as controlled by gas flow meters 17 and 17'. The interior of the quartz window 47 was purged with CO with a flow rate of 50 cm$^3$/min as controlled by a flow meter 19. A pre-cleaned p-Si(1,1,1) substrate 45 was mounted on a stainless steel holder, and both were air-cooled to maintain at 25° C. during the experiment. The system was evacuated to about 700 Pascals using a mechanical vacuum pump via the PHCVD cell outlet 49. The light source was a 200-Watt mercury arc lamp with a power density of about 2W/cm$^2$ as measured by a power meter at the substrate. A 345 nm long pass filter 55 was placed between the light source 51 and the quartz window 47 of the PHCVD cell 43. The photolysis time was about 15 minutes. The resultant deposit was smooth and metallic in appearance. The film thickness measured by a profilometer was about 0.06 μm, corresponding to a deposition rate of about 0.2 μm/hr. X-ray fluorescence spectroscopy showed a Fe/Co ratio of 0.52 and that this concentration ratio was uniform throughout the entire deposit ($\approx 1 \times 2$ cm).

EXAMPLE 4

Preparation of Fe-Co Alloy Thin Film Using $(C_5H_5)FeCo(CO)_6$ Precursor

Figure 3:
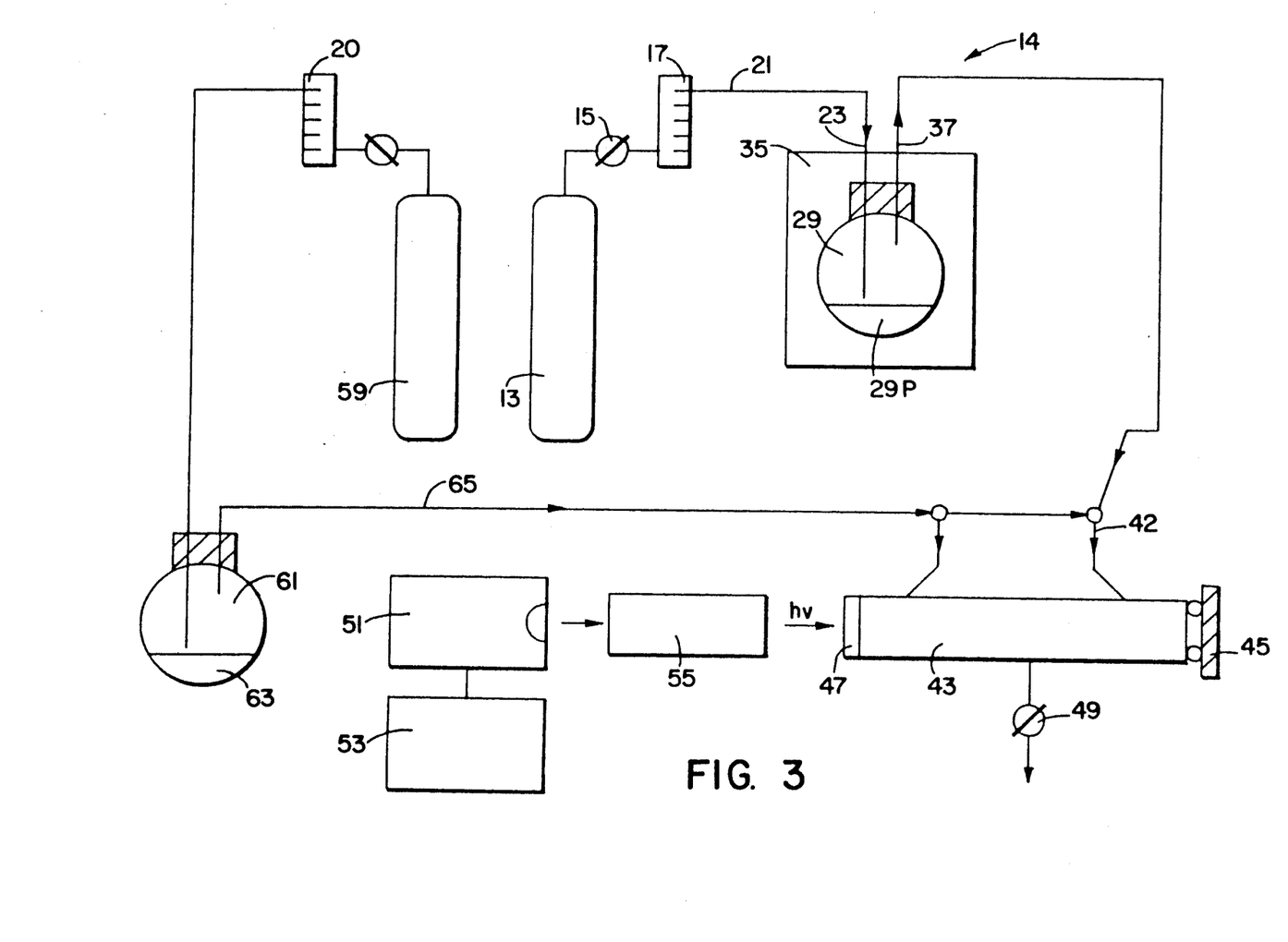
Figure 6:
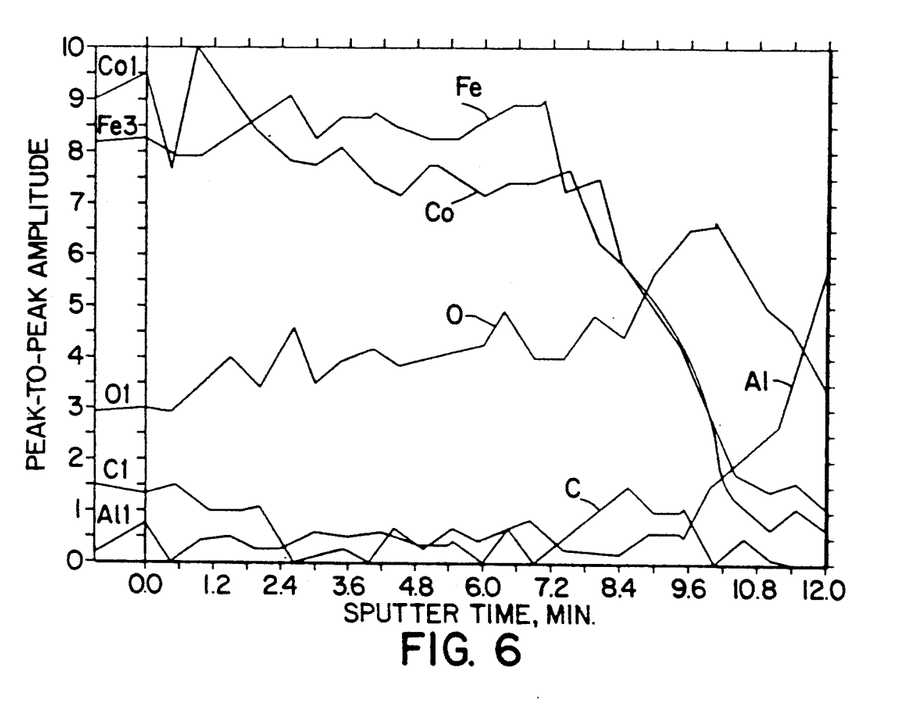
FIGS. 6 and 7 are graphs of bulk concentrations of Fe, Co, O, C and Al, as sensed by Auger electron spectroscopy, versus sputter time for a film prepared according to the invention by photolysis of $(C_5H_5)FeCo(CO)_6$, using CO and $O_2$ carrier gas, respectively.

The PHCVD reaction using $(C_5H_5)FeCo(CO)_6$ was performed using the apparatus represented by FIG. 3, except that no $O_2$ supply was provided. About 1.0 g. $(C_5H_5)FeCo(CO)_6$ was added to a 100-ml round bottom flask 29 placed in an oven 35 set at 50° C. The metal carbonyl vapor was carried into the PHCVD cell 43 with CO carrier gas from a cylinder 13 with a flow rate of 40 cm$^3$/min as controlled by a flow meter 17. The interior of the quartz window 47 was purged with CO with a flow rate of 50 cm$^3$/min as controlled by a flow meter 19. A precleaned Al substrate 45 was mounted on a stainless steel holder, and both were air-cooled to maintain at 25° C. during the experiment. The system was evacuated to about 1,000 Pascals using a mechanical vacuum pump via the PHCVD cell outlet 49. The light source was a 200-Watt mercury arc lamp with a power density of about 2W/cm$^2$ as measured by a power meter at the substrate. The photolysis time was about one hour. The resultant deposit was smooth and metallic in appearance. Scanning electron microscopy analysis of the deposited film revealed a granular surface with particle sizes of 0.1–0.3 μm. The film thickness measured by a profilometer was about 0.2 μm, corresponding to a deposition rate of about 0.2 m/h. X-ray fluorescence spectroscopy showed a Fe/Co ratio of 1.20 and that this concentration ratio was uniform throughout the entire deposit ($\approx 1 \times 2$ cm). Auger electron spectroscopy showed about 45 percent Fe, 41 percent Co, 9 percent O and 5 percent C in the bulk of the deposit (FIG. 6).

EXAMPLE 5

Figure 7:
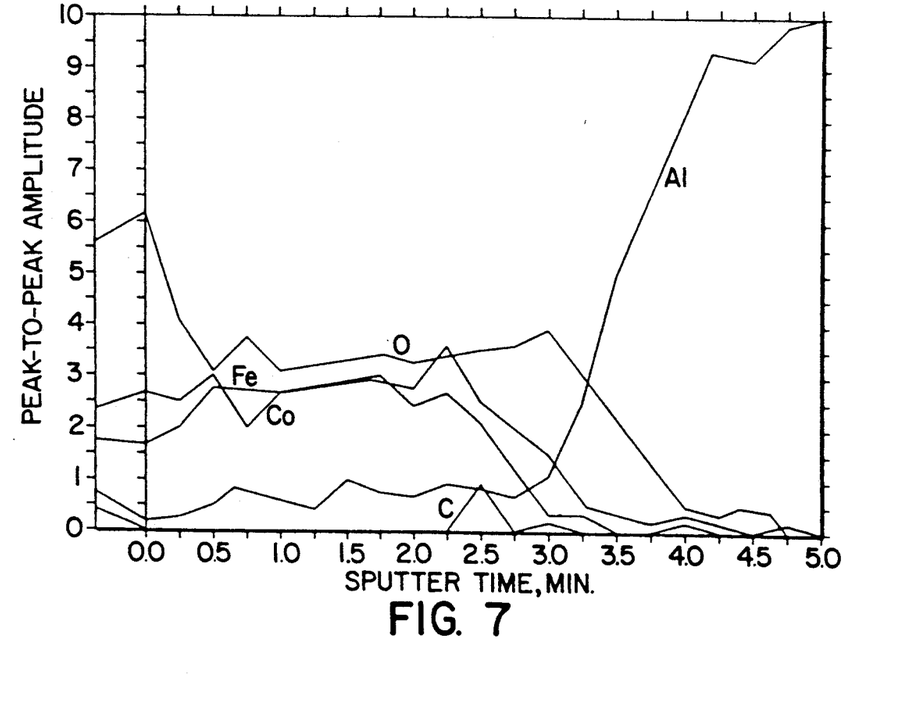

Preparation of Fe-Co Mixed Metal Oxide Thin Film Using $(C_5H_5)FeCo(CO)_6$ Precursor with Added $O_2$ The PHCVD reaction using $(C_5H_5)FeCo(CO)_6$ and $O_2$ was performed using the apparatus represented by FIG. 3. About 1.0 g. $(C_5H_5)FeCo(CO)_6$ was added to a 100-ml round bottom flask 29 placed in an oven 35 set at 50° C. The metal carbonyl vapor was carried into the PHCVD cell 43 with CO carrier gas from a cylinder 13 with a flow rate of 40 cm$^3$/min as controlled by a flow meter 17. The interior of the quartz window 47 was purged with $O_2$ with a flow rate of 50 cm$^3$/min as controlled by a flow meter 19. A pre-cleaned Al substrate 45 was mounted on a stainless steel holder, and both were air-cooled to maintain at 25° C. during the experiment. The system was evacuated to about 1,000 Pascals using a mechanical vacuum pump via the PHCVD cell outlet 49. The light source was a 200-Watt mercury arc lamp with a power density of about 2W/cm$^2$ as measured by a power meter at the substrate. The photolysis time was about one hour. The resultant deposit was smooth and metallic in appearance. X-ray fluorescence spectroscopy showed a Fe/Co ratio of 1.27 and that this concentration ratio was uniform throughout the entire deposit ($\approx 1 \times 2$ cm). Auger electron spectroscopy showed about 42 percent Fe, 33 percent Co, 25 percent O and less than 1 percent C in the bulk of the deposit (FIG. 7).

I claim:

1. A method for deposit of an amorphous alloy thin film on a substrate, the method comprising the steps of:
   providing organometallic precursor material containing a first metal and a second metal that are to be incorporated in the desired alloy;
   heating the precursor material to a vapor temperature $T_v$ to provide a vapor of the first metal and of the second metal at a concentration ratio $r(T_v)$ of the two metals, which depends upon $T_v$, adjacent to the substrate;
   allowing the precursor vapor temperatures to decrease to approximately room temperature;
   irradiating the vapor containing the precursor material with a mercury arc lamp having a power density of about 2W/cm$^2$, to at least partly dissociate the precursor material and provide the first and second metals in gaseous form, adjacent to a face of substrate; and
   allowing the first and second metals in gaseous form to combine as an alloy thereof on the substrate in approximately the concentration ration $r(T_v)$, said substrate being maintained at a temperature of about 25° C. by air cooling thereof.

2. The method of claim 1, further comprising the step of choosing said vapor temperature $T_v$ in the range $-1°-125°$ C.

3. The method of claim 1, further comprising the steps of choosing said first metal and said second metal from a class of magnetically active metals consisting of Fe, Co and Ni.

4. The method of claim 1, further comprising the step of providing said precursor material as a combination of $Fe(CO)_5$ and $Co(CO)_3NO$.

5. The method of claim 1, further comprising the step of providing said precursor material as a combination of $Fe(CO)_5$ and $Co_2(CO)_8$.

6. The method of claim 1, further comprising the step of choosing said precursor material from the class of compounds consisting of $HFeCo_3(CO)_{12}$, $(C_5H_5)FeCo(CO)_6$, $(C_5H_5)Fe_2Co(CO)_9$ and $(C_5H_5)_2FeNi(CO)_3$.

7. The method of claim 1, further comprising the step of choosing said substrate material from a class of materials consisting of glass, Al, Cu, Si, Ge and GaAs.

8. The method of claim 1, further comprising the steps of collecting the portion of said precursor vapor that is not dissociated, at a collection temperature $T_c$; and
   providing this collected precursor vapor as part of said precursor material, thereby recycling part of said precursor vapor.

9. The method of claim 1, wherein the step of irradiating said precursor material vapor comprises the steps of:
   providing a light beam having said wavelength range and focusing the light beam at a position within said vapor adjacent to said face of said substrate; and
   moving the position of light beam focus across said face of said substrate in a direction, at a rate of linear displacement of the position of light beam focus that varies with this position.

10. The method of claim 9, wherein the step of irradiating said precursor material vapor further comprises the step of choosing said rate of linear displacement of said position of said light beam focus to be monotonically decreasing as said position moves toward a position on said face of said substrate.

11. The method of claim 9, wherein the step of irradiating said precursor material vapor further comprises the step of providing said light beam focus with a beam focus diameter that varies with said position of said light beam focus.

12. A method for deposit of an amorphous mixed metal oxide thin film including a first metal and a second metal on a substrate, the method comprising the steps of:

providing an oxygen vapor at a vapor concentration $C_O$;

providing organometallic precursor material containing a first metal and a second metal in approximately the stoichiometric ratio desired in the mixed metal oxide thin film;

heating the precursor material to a vapor temperature $T_v$ to provide a precursor vapor of a vapor concentration $C_m(T_v)$ so that the concentration ratio $r(T_v) = C_m(T_v)/C_O$, which depends upon the vapor temperature $T_v$, is number;

allowing the vapor temperatures to decrease to room temperatures;

irradiating the precursor vapor and the oxygen vapor with a mercury arc lamp having a power density of about $2W/cm^2$, to at least partly dissociate the precursor material and provide the first and second metals in gaseous form, adjacent to a face of substrate; and allowing the first and second metals and oxygen to combine as a mixed metal oxide thin film on the substrate, with a concentration ratio of the first and second metals being approximately $r(T_v)$, said substrate being maintained at a temperature of about 25° C. by air cooling thereof.

13. The method of claim 12, further comprising the step of choosing said vapor temperature in the range −1°–125° C.

14. The method of claim 12, further comprising the step of choosing said precursor material from the class of compounds consisting of $HFeCo_3(CO)_{12}$, $(C_5H_5)FeCo(CO)_6$, $(C_5H_5)Fe_2Co(CO)_9$ and $(C_5H_5)_2FeNi(CO)_3$.

15. The method of claim 12, further comprising the step of providing said precursor material as a combination of $Fe(CO)_5$ and $Co(CO)_3NO$.

16. The method of claim 12, further comprising the step of providing said precursor material as a combination of $Fe(CO)_5$ and $Co_2(CO)_8$.

17. The method of claim 12, further comprising the step of choosing said substrate material from a class of materials consisting of glass, Al, Cu, Si, Ge and GaAs.

18. The method of claim 12, further comprising the steps of collecting the portions of said precursor vapor that are not dissociated, at a selected collection temperature $T_c$; and providing this collected precursor vapor as part of said-precursor material, thereby recycling part of said precursor vapor.

19. The method of claim 12, wherein the step of irradiating said precursor material vapor comprises the steps of:

providing a light beam having said wavelength range and focusing the light beam at a position within said vapor adjacent to said face of said substrate; and moving the position of light beam focus across said face of said substrate in a direction, at a rate of linear displacement of the position of light beam focus that varies with this position.

20. The method of claim 19, wherein the step of irradiating said precursor material vapor further comprises the step of choosing said rate of linear displacement of said position of said light beam focus to be monotonically decreasing as said position moves toward a position on said face of said substrate.

21. The method of claim 19, wherein the step of irradiating said precursor material vapor further comprises the step of providing said light beam focus with a beam focus diameter that varies with said position of said light beam focus.

* * * * *